United States Patent
McGaire

(10) Patent No.: US 7,798,487 B2
(45) Date of Patent: Sep. 21, 2010

(54) PRINT PLATE HANDLING SYSTEM

(75) Inventor: Mark D. McGaire, Surrey (CA)

(73) Assignee: Eastman Kodak Company, Rochester, NY (US)

( * ) Notice: Subject to any disclaimer, the term of this patent is extended or adjusted under 35 U.S.C. 154(b) by 222 days.

(21) Appl. No.: 12/147,950

(22) Filed: Jun. 27, 2008

(65) Prior Publication Data

US 2009/0320706 A1 Dec. 31, 2009

(51) Int. Cl.
*B65H 29/38* (2006.01)
*B41F 27/00* (2006.01)

(52) U.S. Cl. .............. 271/177; 271/181; 101/477; 101/382.1

(58) Field of Classification Search .......... 271/181, 271/177, 178; 101/382.1, 477, 401.1; 198/408, 198/409
See application file for complete search history.

(56) References Cited

U.S. PATENT DOCUMENTS

| | | | | |
|---|---|---|---|---|
| 3,774,783 A | * | 11/1973 | Miller et al. | 414/798.5 |
| 5,427,225 A | * | 6/1995 | Namba | 198/409 |
| 5,595,120 A | * | 1/1997 | Metrope | 101/477 |
| 5,651,823 A | | 7/1997 | Parodi et al. | |
| 6,065,746 A | * | 5/2000 | Tranquilla | 271/176 |
| 6,354,208 B1 | | 3/2002 | Bos et al. | |
| 6,792,862 B1 | * | 9/2004 | Pietrzak et al. | 101/477 |
| 7,555,983 B2 | * | 7/2009 | Iyokawa et al. | 101/477 |
| 2002/0178948 A1 | * | 12/2002 | Platt et al. | 101/477 |
| 2004/0065221 A1 | | 4/2004 | Takeda | |
| 2005/0028699 A1 | | 2/2005 | Kan et al. | |
| 2005/0045214 A1 | | 3/2005 | Davis et al. | |

FOREIGN PATENT DOCUMENTS

| | | |
|---|---|---|
| GB | 1 583 436 A | 1/1981 |
| GB | 2 409 189 A | 6/2005 |
| WO | WO 00/17071 | 3/2000 |
| WO | WO 2008/075319 A | 6/2008 |

* cited by examiner

*Primary Examiner*—Kaitlin S Joerger
(74) *Attorney, Agent, or Firm*—Nelson Adrian Blish

(57) ABSTRACT

An apparatus (100) for repositioning recording media includes a base (18); a support coupled to the base by a pivot (28), wherein the support is adapted to bear a portion of the recording media while positioned at a first position (34) and not bear the portion of the recording media while positioned at a second position (36); and an actuator (32) adapted to pivot the support about the pivot to move the recording media along a path from the first position towards the second position, wherein a direction of movement of the recording media at each point along the path intersects an imageable surface of the portion of the recording media borne by the support at that point, and wherein the support is adapted to bear an additional portion of the recording media as the recording media is moved from the first position towards the second position.

21 Claims, 5 Drawing Sheets

PRINT PLATE HANDLING SYSTEM

FIELD OF THE INVENTION

The invention relates to the repositioning of recordable media subjected to one or more processing steps, and particularly to the repositioning of printing plates with an improved plate stacker to allow for increased processing productivity.

BACKGROUND OF THE INVENTION

Contact printing using high volume presses is commonly employed to print a large number of copies of an image. Contact printing presses utilize printing plates to apply colorants to a surface to form the image. The surface can form part of a receiver medium (e.g. paper) or can form part of an intermediate component adapted to transfer the colorant from its surface to the receiver medium (e.g. a blanket cylinder of a press). In either case, a colorant pattern is transferred to the receiver medium to form an image on the receiver medium.

Printing plates typically undergo various processes to render them in a suitable configuration for use in a printing press. For example, exposure processes are used to form images on an imageable surface of a printing plate that has been suitably treated so as to be sensitive to light or heat radiation. One type of exposure process employs film masks. The masks are typically formed by exposing highly sensitive film media using a laser printer known as an "image-setter." The film media can be additionally developed to form the mask. The film mask is placed in area contact with a sensitized printing plate, which is in turn exposed through the mask. Printing plates exposed in this manner are typically referred to as "conventional printing plates." Typical conventional lithographic printing plates are sensitive to radiation in the ultraviolet region of the light spectrum.

Another conventional method exposes printing plates directly through the use of a specialized printer typically referred to as a plate-setter. A plate-setter in combination with a controller that receives and conditions image data for use by the plate-setter is commonly known as a "computer-to-plate" or "CTP" system. CTP systems offer a substantial advantage over image-setters in that they eliminate film masks and associated process variations associated therewith. Printing plates imaged by CTP devices are typically referred to as "digital" printing plates. Digital printing plates can include photopolymer coatings (i.e. visible light plates) or thermo-sensitive coatings (i.e. thermal plates).

Many types of printing plates also undergo additional processing steps which can include chemical development. For example, chemical development steps are additionally required to amplify a difference between exposed and unexposed areas. Other processing steps can include pre-heating and/or post heating steps. Once exposed or imaged, some printing plates undergo a pre-heating process so as to change the solubility of various regions of the printing plate in a subsequent chemical development process to achieve the desired differentiation between printable and non-printable areas. Post-baking of a chemically developed printing plate can be conducted to impart various desired characteristics to the printing plate, for example, increased plate life. Gumming processes can also be preformed to protect various surfaces of the printing plate from adverse environmental conditions. Further processing steps can include punching and bending procedures which can be used to impart various features on the printing plates to facilitate the mounting and registration of the printing plates on the press.

Various apparatus are employed to guide the printing plates through the various processes paths including various conveyors and gantries, which transport the plates between the various processing stations and present the plates at a given station with a positioning suitable for the particular processing associated with that station. Apparatus known as plate stackers are typically used to adjust an orientation of the printing plates at one or more points along their journey through the various processing steps. Plate stackers can be positioned after a chemical developer, heating or drying apparatus, punching device, etc. A sequence of printing plates is conveyed along a conveying path to various processing stations and the plates are collected and arranged in a stacked orientation by an apparatus such as plate stackers.

FIG. 1A schematically shows a conventional plate stacker 10. Plate stacker 10 is positioned proximate conveyer 15 which conveys a plurality of printing plates 20 along a conveying path 22. Printing plates 20 can include differently sized printing plates. Printing plates 20 are separated from one another along conveying path 22 by plate-to-plate separation distance S. In one form, plate stacker 10 includes a base 18 and a plurality of conveying members which facilitate a transfer of a printing plate 20 from conveyor 15. In this case, the conveying members consist of conveying belts 24, each of the conveying belts 24 having frictional attributes suitable for engaging the printing plates 20 supported thereon. Conveying belts 24 are driven by drive 35. Other plate stackers can employ other forms of conveying members including driven chains, rollers, etc. Plate stacker 10 also includes a plurality of pivoting members 26. In this case, pivoting members 26 are elongated members that are rotationally coupled to pivot 28 and are nested with conveying belts 24 as schematically shown by the plan view of plate stacker 10 in FIG. 1C.

As shown in FIG. 1A, conveying belts 24 transfers printing plate 20A from conveyor 15 until a leading edge portion 21 of printing plate 20A is detected by sensor 30, which stops the conveying belts 24. At this point, actuator 32 is operated to cause the pivoting members 26 to tilt or pivot about pivot 28 to engage printing plate 20A at a first position 34 and rotate it about a path to a second position 36 shown in FIG. 1B. In this case, second position 36 is a position in which the printing plate 20A is no longer supported by pivoting members 26 and is stacked with other printing plates 20 on plate stack 38. Printing plates 20 in plate stack 38 are shown separated from one another for clarity.

Printing plate 20A is moved from a first position 34 and a first orientation (i.e. inclination angle $\alpha$) in which it is engaged by pivoting members 26 to second position 36 and orientation (i.e. inclination angle $\beta$) in which it ceases to be engaged by pivoting members 26. Upon stacking printing plate 20A on plate stack 38, pivoting members 26 are rotated back to their starting position. Pivoting members 26 can be driven to oscillate between their nested position and their plate stacking position.

A next printing plate 20B continues to move as pivoting members 26 undergo their oscillatory movement. Pivoting members 26 are required to return to their nested position prior to the transfer of a predetermined portion of printing plate 20B from conveyor 15. A return to the nested position is required since pivoting members 26 could strike printing plate 20B if transferred by conveying belts 24 prior to the return of pivoting members 26. Accordingly, the time taken by pivoting members 26 to engage a first printing plate 20 at first position 34, move the first printing plate 20 from first position 34 to second position 36, and then return back to first position 34 prior to the arrival of a second printing plate 20 can unduly limit the allowable plate-to-plate separation distance S. Consequently, plate stacker 10 can become a bottleneck in the processing of printing plates 20 by requiring a larger than desired plate-to-plate separation distance S between printing plates 20 along conveying path 22. Current exposure, chemical development and other processing systems have made, and continue to make, significant productivity improvements with respect to their specific processing and automation capabilities. These improvements can provide for a continuous stream of imaged and processed plates with continuously decreasing plate-to-plate separation requirements. These productivity improvements can be hindered by a plate stacker 10 that can not handle printing plates 20 provided at these higher rates.

There is a need for improved apparatus for re-orienting recording media such as printing plates along a conveying path. There is also a need for a plate stacker with enhanced plate stacking productivity capabilities.

SUMMARY OF THE INVENTION

Briefly, according to one aspect of the present invention an apparatus for repositioning recording media includes a base; a support coupled to the base by a pivot, wherein the support is adapted to bear a portion of the recording media while positioned at a first position and not bear the portion of the recording media while positioned at a second position; and an actuator adapted to pivot the support about the pivot to move the recording media along a path from the first position towards the second position, wherein a direction of movement of the recording media at each point along the path intersects an imageable surface of the portion of the recording media borne by the support at that point, and wherein the support is adapted to bear an additional portion of the recording media as the recording media is moved from the first position towards the second position.

The invention and its objects and advantages will become more apparent in the detailed description of the preferred embodiment presented below.

BRIEF DESCRIPTION OF THE DRAWINGS

Embodiments and applications of the invention are illustrated by the attached non-limiting drawings. The attached drawings are for purposes of illustrating the concepts of the invention and may not be to scale.

DETAILED DESCRIPTION OF THE INVENTION

Throughout the following description specific details are presented to provide a more thorough understanding to persons skilled in the art. However, well-known elements may not have been shown or described in detail to avoid unnecessarily obscuring the disclosure. Accordingly, the description and drawings are to be regarded in an illustrative, rather than a restrictive sense.

Figure 2A:
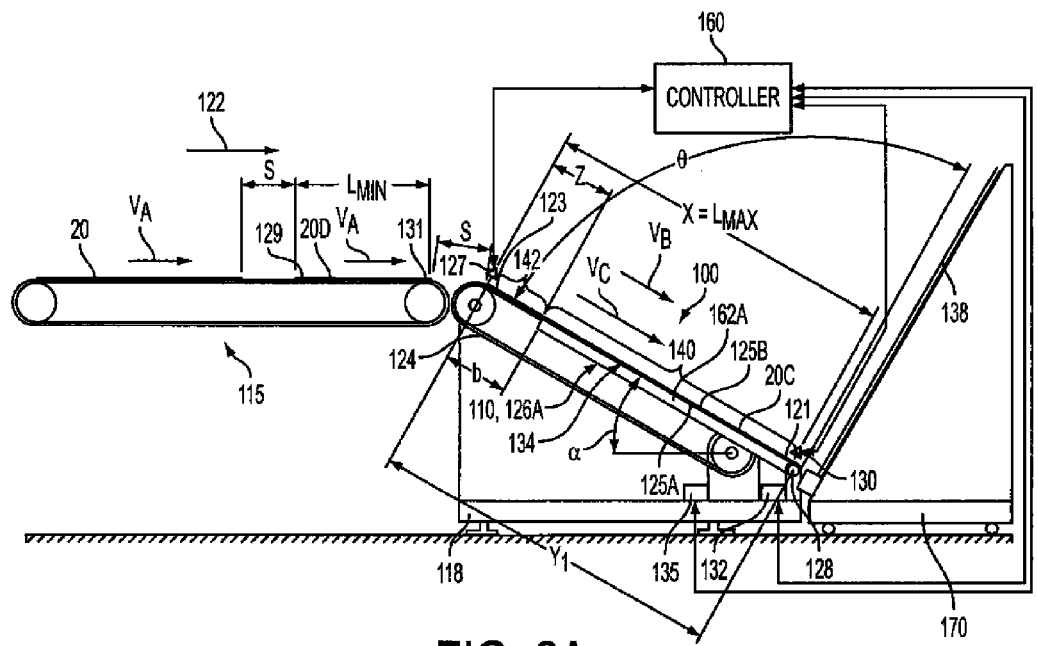
FIG. 2A is schematic side view of a plate repositioning apparatus engaging a printing plate at a first position as per an example embodiment of the invention.

FIG. 2A shows an apparatus 100 as per an example embodiment of the invention. In this example embodiment of the invention, apparatus 100 is employed to reposition recording media while the media travels along a conveying path 122. Conveying path 122 may extend along various directions and is not limited to the single direction shown in FIG. 2A. In this example embodiment, the recording media are printing plates 20 that are to be used in a contact printing operation. A conveyor 115 supports a surface of each of the printing plates 20 as each of the printing plates 20 is conveyed along conveying path 122. At various positions along conveying path 122, the printing plates 20 are conveyed along directions that are substantially tangential to their supported surfaces. In this example embodiment, the printing plates 20 are traveling in tandem along conveying path 122 with substantially the same speed. In this example embodiment of the invention, printing plates 20 are traveling with a conveying speed $V_A$ and are separated by the aforementioned plate-to-plate separation distance S. Conveying speed $V_A$ and plate-to-plate separation distance S can be related to various process steps printing plates 20 may have undergone prior to their illustrated positioning in FIG. 2A.

Figure 2B:
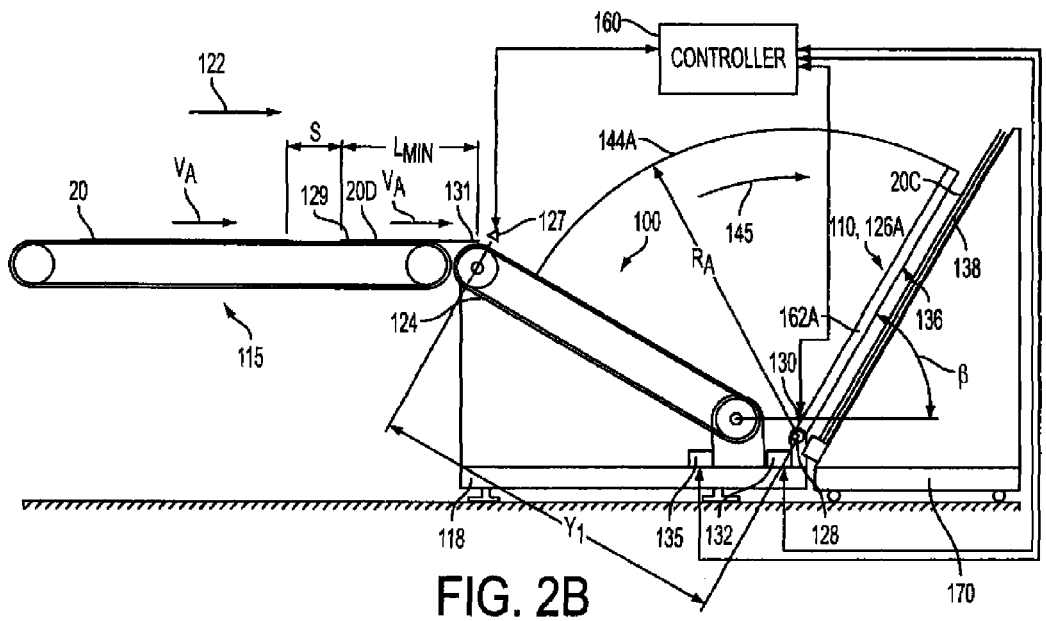
FIG. 2B is a schematic side view of the plate repositioning apparatus of FIG. 2A repositioning the engaged printing plate at a second position.
Figure 2C:
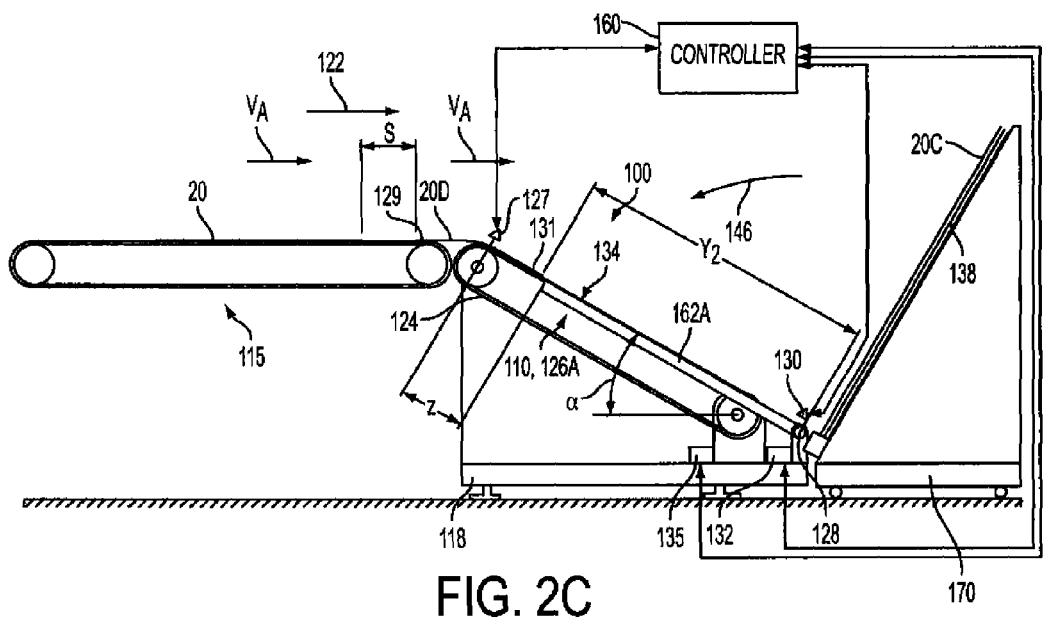
FIG. 2C is a schematic side view of the plate repositioning apparatus of FIG. 2A in which pivoting members have returned to the first position from the second position prior to the arrival of a next printing plate.
Figure 2D:
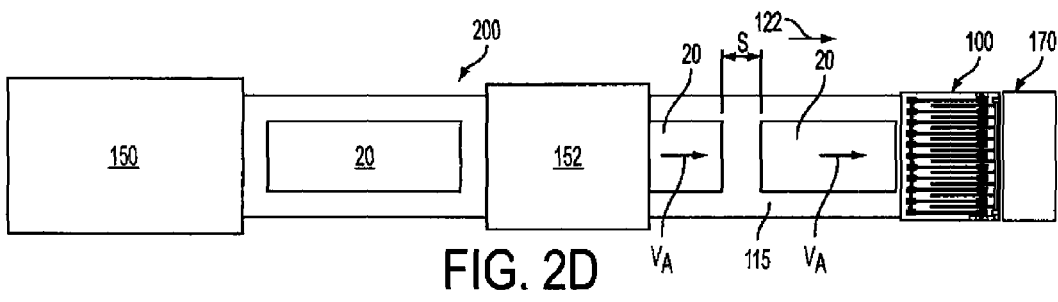
FIG. 2D is a schematic block diagram of a printing plate processing system incorporating a plate repositioning apparatus according to an example embodiment of the invention.

FIG. 2D shows a schematic block diagram of a printing plate processing system 200 incorporating apparatus 100 and conveyor 115 according to an example embodiment of the invention. In this example embodiment of the invention, each of the printing plates 20 undergoes an exposure step in an exposure device 150 (e.g., a CTP imager) and a development step in a chemical developer 152 prior to being conveyed along conveying path 122 to apparatus 100. It is to be understood however, that printing plates 20 can also move along a conveying path 122 that moves through other systems that are not shown for clarity. Each of the printing plates 20 will be conveyed through the various sub-systems of printing plate processing system 200 at various speeds. Current conveying speeds associated with typical chemical developers 152 can be in the range in 1200 mm/min or less, or 3000 mm/min or less in other systems. In this example embodiment of the invention, conveying speed $V_A$ is related to the speed of the chemical developer 152 as printing plates 20 are transferred through it. Accordingly, the plate-to-plate separation distance S is related to the ability to sequentially feed printing plates 20 to the chemical developer 152 and conveying speed $V_A$. Some chemical developers 152 additionally require that the printing plates 20 be presented with an orientation suitable for entrance into the developer. In particular, larger printing plates 20 are usually fed into various chemical developers 152 such that a shorter edge rather than a longer edge enters the chemical developer 152 to improve the development efficiency and reduce the required size of chemical developer 152. Accordingly, a leading edge of various larger sized printing plates 20 that are conveyed along conveying path 122 is typically a shorter edge of the printing plate.

Current throughputs of various exposure devices 150 have improved significantly to match, and sometimes exceed the associated chemical development speeds. Reductions in typical plate-to-plate separation distances S have occurred with these improvements. For example, various CTP devices manufactured by the Eastman Kodak Company can expose and feed printing plates 20 comprising lengths on the order of two meters such that successive printing plates 20 are separated from one another by approximately a seven second gap. These exposure rates can lead to plate-to-plate separation distances S in the range of about 140 mm to about 350 mm for corresponding processing speeds of 1200 mm/min to 3000 mm/min. Larger plate-to-plate separation distances S are typically associated with printing plates 20 that are longer than two meters in length. After leaving chemical developer 152, each printing plate 20 is sequentially transferred to apparatus 100.

In this example embodiment of the invention, apparatus 100 is a plate stacker, although other example embodiments of the invention can include other apparatus which reposition a recordable media such as a printing plate 20 by supporting a portion of the printing plate 20 and conveying the printing plate 20 along a path such that the direction of movement at each point along the path intersects a plane of the supported surface of the printing plate 20 at that point. Apparatus 100 includes a plurality of driven conveying members 124. Conveying members 124, which can include belts, chains, and other suitable movable support members, engage a surface of printing plate 20 to convey the printing plate. In this example embodiment, a surface 125A of a printing plate 20C is supported. Surface 125A is opposite to an imageable surface 125B which is adapted to form images thereupon. In this example embodiment, imageable surface 125B is imaged by exposure device 150. Drive 135 is operated to move conveying members 124 to facilitate a transfer of printing plate 20C from conveyor 115 until a leading edge portion 121 of printing plate 20C is detected by sensor 130 upon which the conveying members 124 are no longer driven by drive 135. In various example embodiments of the invention, conveying members 124 may continue to be driven after sensor 130 detects leading edge portion 121. In these embodiments, the leading edge portion 121 may abut against various stops (not shown) and relative movement may occur between the stopped printing plate 20C and the continuously driven conveying members 124.

An additional sensor 127 is employed in the vicinity of a transition between conveyor 115 and conveying members 124. In this example embodiment of the invention, sensor 127 is used to detect a trailing edge portion 123 of printing plate 20C. In this illustrated embodiment, both sensors 127 and 130 are in communication with controller 160. For clarity, both sensors 127 and 130 are schematically shown positioned above printing plate 20C. It is to be understood however that sensors 127 and 130 are positioned to not conflict with a movement of the various printing plates 20. Various signals provided by the sensors 127 and 130 cause controller 160 to control drive 135 in a desired fashion. For example, in this illustrated embodiment, conveying members 124 are operated to convey printing plate 20C with a speed $V_B$ that is approximately equal to conveying speed $V_A$ as the printing plate 20C transitions from conveyor 115 to conveying members 124.

Conveying members 124 are adapted to cause leading edge portion 121 of printing plate 20C to move a distance that is approximately equal to maximum plate length $L_{MAX}$ of the various printing plates 20 processed by printing plate processing system 200. In the case of printing plates 20 that comprise this maximum length, these plates are conveyed by conveying members 124 at speed $V_B$ until their leading edge portions are detected by sensor 130 at which point their trailing edges will also be in the detection range of sensor 127. However, in the case of printing plates 20 whose lengths are smaller than the $L_{MAX}$ value, their trailing edges will be detected by sensor 127 prior to the detection of their leading edges by sensor 130. In this illustrated embodiment, printing plate 20C comprises a length that is equal to the maximum plate length $L_{MAX}$ that is processed by printing plate processing system 200 while a second printing plate 20D comprises a length that is equal to the minimum plate length $L_{MIN}$ that is processed by printing plate processing system 200. Accordingly, printing plate 20D would subsequently be conveyed by conveying members 124 at speed $V_B$ until its trailing edge portion 129 is detected by sensor 127. At this point, controller 160 would then cause drive 135 to operate conveying members 124 to convey printing plate 20D with a speed $V_C$ that is greater than $V_B$. Throughput would thereby be increased as printing plate 20D would be conveyed at increased speed $V_C$ until its leading edge portion 131 is detected by sensor 130.

In this example embodiment of the present invention, sensor 130 is spaced from sensor 127 by a sensor-to-sensor distance X approximately equal to maximum plate length $L_{MAX}$. Sensor-to-sensor distance X need not be equal to a physical spacing between sensors 127 and 130 and can be adjusted to account for the various detection ranges of sensors 127 and 130. In this example embodiment, printing plates 20 having lengths on the order of maximum plate length $L_{MAX}$ (e.g. printing plate 20C) would be conveyed by conveying members 124 at speeds predominantly on the order of speed $V_B$. Those skilled in the art will realize that other sensor configurations can easily be incorporated by other example embodiments of the invention. For example, sensor 127 can be adapted to detect both the leading edge and trailing edge portions of printing plates 20 and controller 160 can be programmed to determine the plate length based at least on the detection information provided by sensor 127 and the conveying speed of the conveying members 124 at the time of detection. Upon determination of the plate length, conveying members 124 can be controlled to improve the conveying throughput. Sensors 127 and 130 can include various optical, mechanical, and electrical components as known in the art.

Apparatus 100 includes a support 110 adapted to support various portions of each of the printing plates 20 conveyed by conveying members 124. In this example embodiment of the invention, support 110 includes a plurality of pivoting members 126A that are pivotally coupled to base 118 at pivot 128. Pivoting members 126A are elongate in form and are nested between conveying members 124 in a location that does not obstruct the movement of printing plate 20C as it is conveyed by conveying members 124 towards a position in the vicinity of pivot 128. When the leading edge portion 121 of printing plate 20C is detected by sensor 130, relative movement is effected between printing plate 20C and pivoting members 126A. In this example embodiment, actuator 132, which is coupled to the pivoting members 126A, is operated to cause the pivoting members 126A to tilt about pivot 128 to engage surface 125A of printing plate 20C at a first position 134 and move the supported printing plate to a second position 136 along direction 145. Actuator 132 can include suitable motors, pneumatic cylinders, and the like.

As shown in FIGS. 2A and 2B, printing plate 20C is moved from first position 134 with a first orientation (i.e. inclination angle α) in which printing plate 20C is engaged by pivoting members 126A to second position 136 with a second orientation (i.e. inclination angle β) in which printing plate 20C ceases to be engaged by pivoting members 126A and is subsequently stacked onto plate stack 138. In this example embodiment of the invention, second position 136 is located past an over-centered position of pivoting members 126A.

In this example embodiment of the invention, supported printing plate 20C is conveyed along an arcuate path to be stacked on plate stack 138. Plate stack 138 is supported on a movable carrier 170 which can be employed to move plate stack 138 to alternate locations such as in the vicinity of a printing press, for example.

Pivoting members 126A include one or more elements adapted to support various portions of the printing plate 20C. In this example embodiment, pivoting members 126A include a first element 162A adapted to engage and support printing plate 20C at first position 134. In this example embodiment, first elements 162A are substantially straight elongate members. First elements 162A are sized to substantially engage and bear a portion 140 of printing plate 20C that less than the entirety of printing plate 20C. In this example embodiment, each of the first elements 162A has a length that corresponds to a length of the engaged portion 140. It is to be noted however, that complete contact between each of the first elements 162A and the portion of surface 125A corresponding to portion 140 may or may not occur. Factors such as plate curl may lead to some minor areas of non-contact. However, for the purpose of this discussion, the engaged portion 140 of printing plate 20C is considered to be borne by first element 162A at first position 134 even if minor areas of non-contact exist. In this example embodiment, each of the first elements 162A has a length that is less than the length of printing plate 20C. In this example embodiment, each of the first elements 162A has a length that is less than the maximum plate length $L_{MAX}$.

As shown in FIG. 2A, portion 140 of printing plate 20C is borne by first elements 162A at first position 134 while an additional portion 142 of printing plate 20C overhangs first elements 162A at first position 134. Pivoting members 126A are sized to sweep out a region 144A having a radius of curvature $R_A$ as they are moved between first position 134 and second position 136. In this example embodiment of the invention, first elements 162A are sized to cause radius of curvature $R_A$ to be less than the length of printing plate 20C. In this example embodiment of the invention, first elements 162A are sized to cause radius of curvature $R_A$ to be less than the maximum plate length $L_{MAX}$.

After pivoting members 126A have moved to second position 136, they are moved back towards first position 134 along direction 146 which is opposite to direction 145, that is, pivoting members 126A undergo an oscillating movement during operation, from a first position to a second position. FIG. 2C shows pivoting members 126A after they have moved back into to their nested position with conveying members 124. In this illustrated embodiment of the invention, printing plate 20D has moved and is engaged by conveying members 124 while pivoting members 126A have moved from first position 134 to second position 136 and back towards first position 134. Previously, first printing plate 20C was positioned such that its trailing edge portion 123 was spaced from pivot 128 by a first distance $Y_1$ when printing plate 20C was engaged by pivoting members 126A at first position 134. Advantageously, first elements 162A have been sized to allow second printing plate 20D to move to a position where its leading edge portion 131 is spaced from pivot 128 by a second distance $Y_2$ that is less than the first distance $Y_1$. This movement occurs by the time that pivoting members 126A have returned back to first position 134. The appropriate sizing of first elements 162A have allowed second printing plate 20D to move by an amount sufficient to avoid a collision with pivoting members 126A while allowing for the required plate-to-plate separation distance S between it and printing plate 20C.

In this example embodiment of the invention, a minimum plate-to-plate separation distance $S_{MIN}$ that can be handled by apparatus 100 is determined at least in part by the minimum length $L_{MIN}$ of a printing plate 20 that is conveyed by conveying members 124. That is, the cycle time of apparatus 100 is related to: the time required by conveying members 124 to move a first printing plate 20 such that its leading edge is detected by sensor 130, the time required to move the first printing plate 20 from first position 134 to second position 136, and the time required to move pivoting members 126A back to first position 134 from the second position 136. A printing plate 20 comprising the minimum length $L_{MIN}$ (i.e. a "smallest printing plate 20") will have the shortest cycle time since it will be conveyed by conveying members 124 with the faster speed $V_C$ during a portion of its travel as previously described. Therefore in this example embodiment of the invention, the minimum plate-to-plate separation distance $S_{MIN}$ can be estimated by the following relationship as it pertains to apparatus 100:

$$S_{MIN} \cong S_{CON} + S_{TILT} - S_{STACK}; \text{ where:} \quad (1)$$

$S_{MIN}$ is the minimum plate-to-plate separation distance;

$S_{CON}$ is the distance that a second printing plate 20 is conveyed by conveyor 115 during the time that the smallest printing plate 20 is conveyed by conveying members 124 after the trailing edge portion of the smallest printing plate 20 passes sensor 127 and its leading edge portion is detected by sensor 130;

$S_{TILT}$ is the distance that the second printing plate 20 is conveyed by conveyor 115 during the time that pivoting members 126A move from first position 134 to second position 136 and then back to first position 134; and $S_{STACK}$ is the distance that the second printing plate 20 is conveyed by conveying members 124 such that the leading edge portion of the second printing plate 20 passes sensor 127 and is conveyed to a position proximate to, but not contacting with, pivoting members 126A when they are returned to first position 134 from second position 136.

Figure 1A:
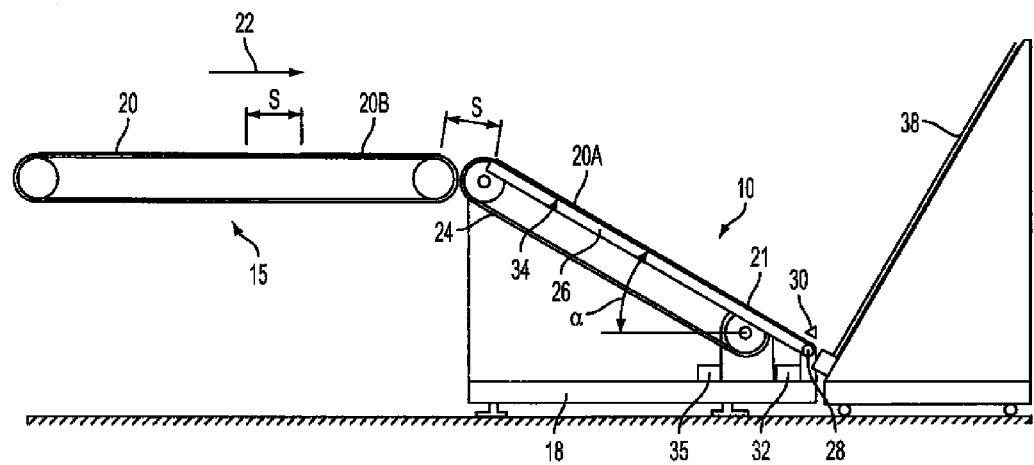
FIG. 1A is a schematic side view of a conventional plate stacker engaging a printing plate at a first position.
Figure 1B:
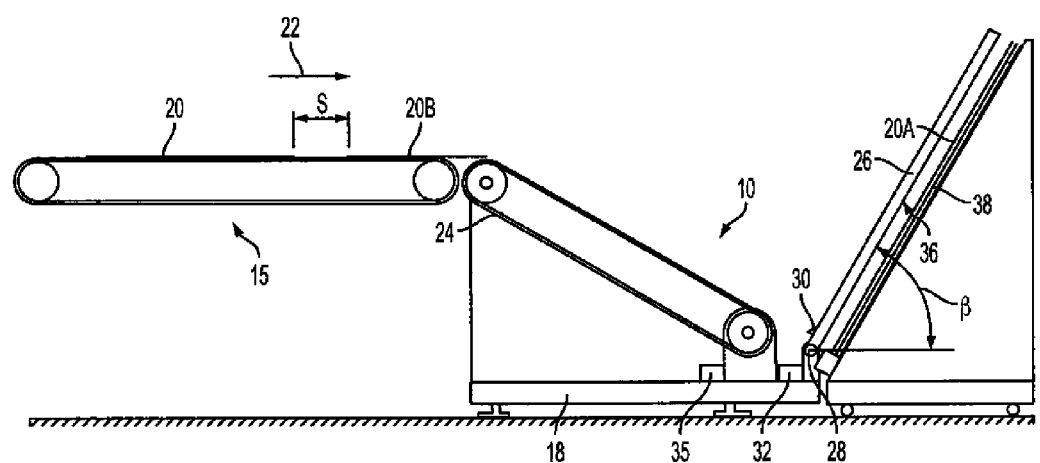
FIG. 1B is a schematic side view of the conventional plate stacker of FIG. 1A repositioning the engaged printing plate at a second position.
Figure 1C:
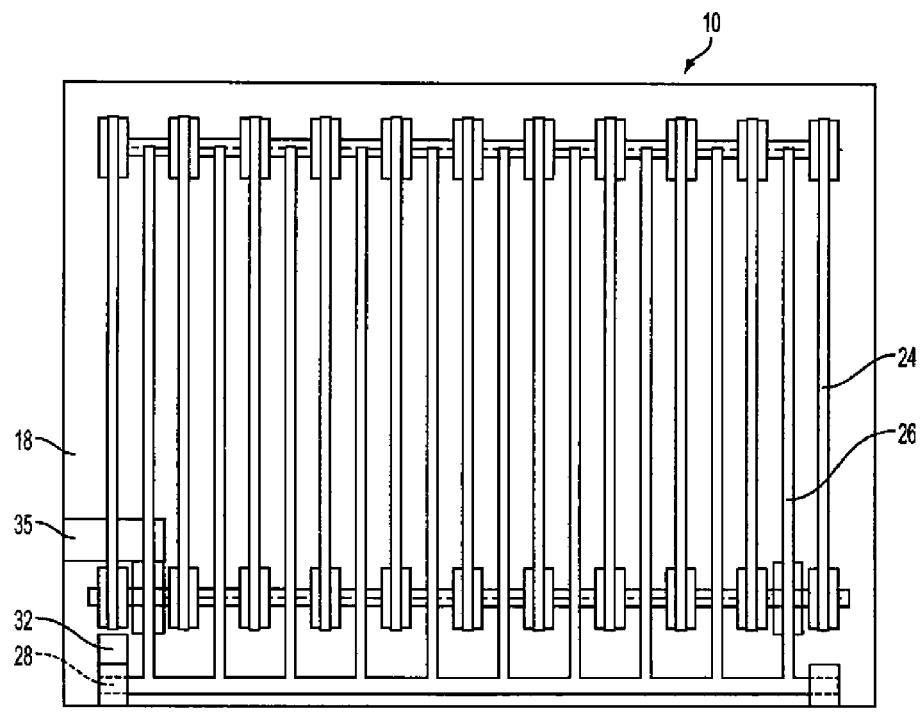
FIG. 1C is a schematic plan view of the conventional plate stacker of FIG. 1A.

An example comparing the minimum plate-to-plate separation distance $S_{MIN}$ of previously described conventional plate stacker 10 as compared with apparatus 100 of this invention for different conveying speeds $V_A$ is shown in TABLE I. Operating conditions for the operation of both these devices are as follows:

$V_A$ is a conveying speed of conveyor 115 which is varied from 1200 mm/min to 2500 mm/min in the various CASES;

$V_B$ is a low speed of conveying members 124. Speed $V_B$ is substantially equal to conveying speed $V_A$ and is employed to convey the smallest printing plate 20 until its trailing edge portion is detected by sensor 127;

$V_C$ is the high speed of conveying members 124. Speed $V_C$ is equal to 8000 mm/min and employed to convey the smallest printing plate 20 after its trailing edge portion is detected by sensor 127;

$T_{PIV}$ is the time required to move pivoting members 126A from first position 134 to second position 136 and then back to first position 134. In these examples, pivoting time $T_{PIV}$ is equal to 6.5 sec;

$L_{MIN}$=490 mm;

X is the sensor-to-sensor distance and is substantially equal to the maximum plate length $L_{MAX}$ which in these examples equals 3000 mm; and Z is the distance between sensor 127 and the end of pivoting members 126A positioned at first position 134. In this illustrated embodiment of the invention, sensor-to-pivoting member distance Z is approximately equal to the difference between sensor-to-sensor distance X and radius of curvature $R_A$. In TABLE I, sensor-to-pivoting member distance Z is equal to 0 mm in CASES A and C to approximate the characteristics of the conventional plate stacker 10 in FIGS. 1A, 1B, and 1C. In TABLE I, sensor-to-pivoting member distance Z is equal to 450 mm in CASES B and D to represent the characteristics of apparatus 100 of the present invention.

Under these operating parameters $S_{CON}$, $S_{TILT}$, and $S_{STACK}$ can be estimated from the following relationships:

$$S_{CON} \cong (X - L_{MIN}) * V_A / V_C; \quad (2)$$

$$S_{TILT} \cong V_A * T_{PIV}; \text{ and} \quad (3)$$

$$S_{STACK} \cong Z. \quad (4)$$

separation distance S required by exposure device 150 is met and enhanced overall throughput is achieved.

Further analysis of relationships (1), (2), (3), and (4) suggests that larger plate-to-plate separation distances S may be achieved by further shortening first elements 162A to increase sensor-to-pivoting member distance Z. There are limits however to the extent by which first elements 162A can be shortened. Since apparatus 100 is adapted to handle printing plates 20 of various sizes including larger ones such as printing plate 20C, various portions (e.g. additional portion 142) of some of these printing plates 20 will overhang first elements 162A when they are engaged by pivoting members 126A at first position 134. These overhanging portions will be subjected to drag forces caused by air resistance as the pivoting members 126A move these printing plates 20 from first position 134 to second position 136. If the overhanging portions are sufficiently large, then the resulting drag forces can act on the overhanging portions with magnitudes sufficient to bend and damage the printing plates 20. Potential damage can include kinking or plastic deformation of the printing plates 20.

The drag forces acting on an overhanging portion are related to the speed with which the overhanging portion is conveyed from first position 134 to second position 136. This speed is related to the pivoting time $T_{PIV}$ and the distance that the overhanging portion is positioned from pivot 128. Additional analysis of relationships (1), (2), (3), and (4) suggests that smaller minimum plate-to-plate separation distances $S_{MIN}$ can be achieved by reducing the pivoting time $T_{PIV}$. However, reducing pivoting time $T_{PIV}$ in attempt to further decrease the minimum plate-to-plate separation distance

TABLE I

| | CASE | | | | |
|---|---|---|---|---|---|
| | A | B | C | D | E |
| $V_A$ | 1200 mm/min | 1200 mm/min | 2500 mm/min | 2500 mm/min | 2500 mm/min |
| Z | 0 mm | 450 mm | 0 mm | 450 mm | 600 mm |
| $S_{TILT}$ | 128 mm | 128 mm | 267 mm | 267 mm | 267 mm |
| $S_{CON}$ | 377 mm | 377 mm | 785 mm | 785 mm | 785 mm |
| $S_{STACK}$ | 0 mm | 450 mm | 0 mm | 450 mm | 600 mm |
| $S_{MIN}$ | 505 mm | 57 mm | 1051 mm | 601 mm | 451 mm |

It is desired that the throughput of printing plate processing system 200 match at least the ability of exposure device 150 to image and provide printing plates 20. In this case, exposure device 150 can image and provide a sequence of relatively large printing plates 20 (e.g. printing plate 20C) with plate-to-plate gaps of approximately 15 seconds. At a conveying speed $V_A$ of 1200 mm/min, a plate-to-plate separation distance S of 300 mm (i.e. 1200 mm/min*15 sec/60 sec/min) would be required to meet this throughput whereas a conveying speed $V_A$ of 2500 mm/min would require a plate-to-plate separation distance S of 625 mm (i.e. 2500 mm/min*15 sec/60 sec/min). Analysis of TABLE 1 indicates that a conventional plate stacker with a negligible sensor-to-pivoting member distance Z (i.e. CASES A and C) requires a greater minimum plate-to-plate separation distance $S_{MIN}$ in both of these cases and therefore requires a reduction in the throughput of exposure device 150. On the other hand, when the pivoting members 126A are adapted to provide a sensor-to-pivoting member distance Z (i.e. 450 mm in CASES B and D) sufficient to accommodate the additional movement of the next printing plate 20 within apparatus 100, the plate-to-plate $S_{MIN}$ can lead to plate damage especially when the overhanging portion is positioned from pivot 128 by relatively large distances as would be the case for printing plate 20C whose length is equal to maximum plate length $L_{MAX}$. Additionally, in some example embodiments of the present invention, reductions in pivoting time $T_{PIV}$ may require a much larger actuator 132, especially when printing plates 20 as large as printing plate 20C are moved. Printing plates 20 with larger surface areas encounter larger amounts of air resistance which further increase as the pivoting speed is increased. Accordingly, actuators 132 that are suitably sized to provide these decreased pivoting times $T_{PIV}$ may be cost prohibitive and/or lead to additional safety issues.

The following relationship can be used to estimate the pivoting speed that will likely increase the probability of kinking in a printing plate 20:

$$V \cong [(2 * t^2 * \sigma_y)/(3 * \rho * C_D * b^2)]^{1/2}, \text{ where:} \quad (5)$$

V is a pivoting speed as measured from a center of the overhanging portion;

t is a thickness of printing plate 20;

$\sigma_y$ is a yield strength of printing plate 20;

ρ is an air density;
$C_D$ is a drag coefficient; and
b is a length of the overhanging portion.

Assuming that the printing plate 20 is conveyed from first position 134 to the second position 136 over an angular extent θ on a radius of travel related to the distance between the center of the overhanging portion and pivot 128, the time of travel can then be estimated from the following relationship:

$$T \cong \theta/(V/(Y_1 - b/2)), \text{ where:} \quad (6)$$

T is the time to move from first position 134 to second position 136;
θ is the angular extent of travel in radians approximately shown in FIG. 2A;
$Y_1$ is the first distance from pivot 128 to the trailing edge of printing plate 20 positioned on pivoting members 126A; and
V and b are as previously defined.

The pivoting time $T_{PIVKINK}$ that could result in kinking can then be estimated from the following relationship:

$$T_{PIVKINK} \cong 2*(T + ACC), \text{ where:} \quad (7)$$

$T_{PIVKINK}$ is the pivoting time $T_{PIV}$ required to move pivoting members 126A from first position 134 to second position 136 and back to first position 134 with an increased probability that the printing plate 20 will kink;
T is the time required to move from first position 134 to second position 136; and
ACC is the acceleration/deceleration time and time required for extraneous factors such as loose pivot member couplings, etc.

Referring to TABLE 1, CASE E includes a sensor-to-pivoting member distance Z of 600 mm which was selected to additionally decrease the allowable minimum plate-to-plate separation distance $S_{MIN}$ to 451 mm to further increase the overall throughput. In this example embodiment, the length of the overhanging portion b is approximately equal to length sensor-to-pivoting member distance Z (i.e. 600 mm) since the length of plate 20C is equal to maximum plate length $L_{MAX}$. Under the following conditions: σ≈100 Mpa, t=0.3 mm, $C_D \cong 1.6$, $\rho \cong 1.2$ kg/m$^3$, $Y_1 \cong L_{MAX}$=3000 mm, θ=π/2 radians and ACC≅2 sec, the use of relationships (5), (6), and (7) provide a $T_{PIVKINK}$ value of 6.5 sec. This $T_{PIVKINK}$ value is equal to the pivoting time $T_{PIV}$ value that was previously estimated to be required to achieve a minimum plate-to-plate separation distance $S_{MIN}$ of 451 mm as shown in TABLE I. Although reducing the length of pivoting members 126A to provide a sensor-to-pivoting member distance Z of 600 mm can further increase the overall throughput of processing system 200, a higher potential to kink the printing plates such as printing plate 20C appears to exist for this specific case.

Figure 3A:
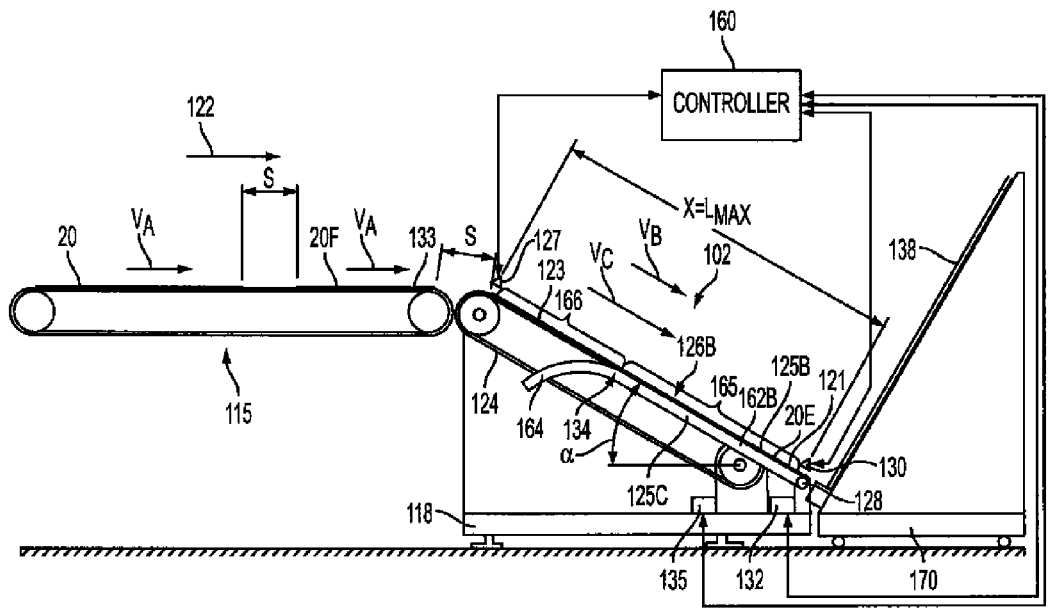
FIG. 3A is schematic side view of a plate repositioning apparatus engaging a printing plate at a first position as per another example embodiment of the invention.

FIG. 3A schematically shows apparatus 102 as per another example embodiment of the present invention. Apparatus 102 includes several of the components of apparatus 100 which are identified by identical part numbers for clarity. Apparatus 102 includes a plurality of pivoting members 126B which are shown contacting surface 125C of a large printing plate 20E. Pivoting members 126B engage a first portion 165 of printing plate 20E at first position 134 after the printing plate 20E has been conveyed by conveying members 124 in manner similar to that previously described. In this illustrated embodiment, pivoting members 126B are elongate members that include second elements 164 in addition to first elements 162B. An additional portion 166 of printing plate 20E overhangs first elements 162B. Second elements 164 are configured to not engage and bear additional portion 166 at first position 134. The additional portion 166 is spaced further apart from pivot 128 than the first portion 165. In this example embodiment, portions of second elements 164 assume an orientation that is not parallel to parts of surface 125C that are supported by first elements 162B at first position 134 (i.e. inclination angle α). In this example embodiment, second elements 164 are elongated members which are made up of portions that extend along various directions that intersect a direction that the first elements 162B extend along. In this example embodiment, the second elements 164 include a curved portion.

Figure 3B:
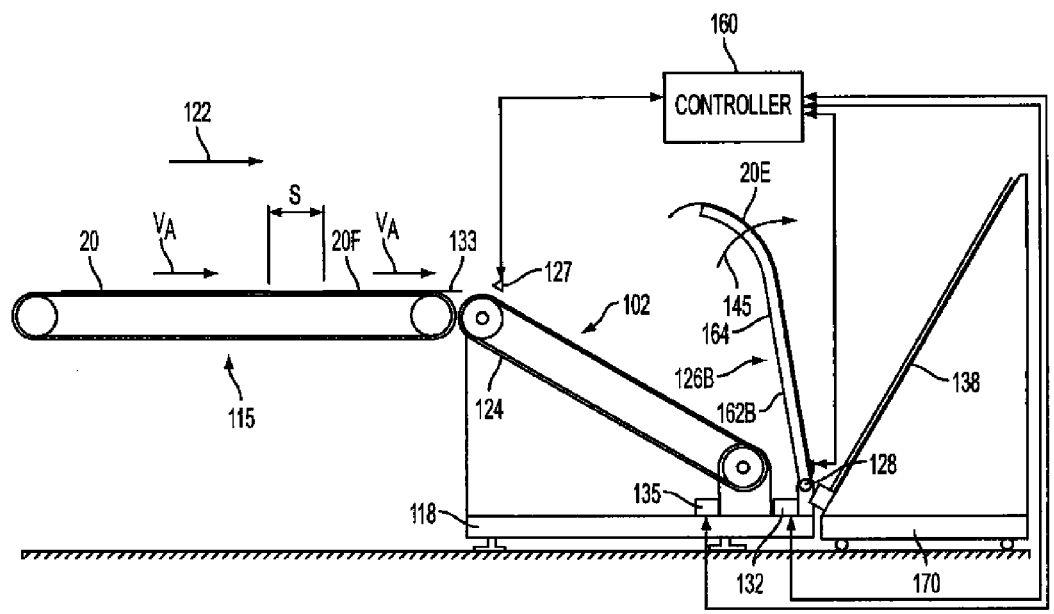
FIG. 3B is a schematic side view of the plate repositioning apparatus of FIG. 3A repositioning the engaged printing plate at an intermediate position between the first position and a second position.
Figure 3C:
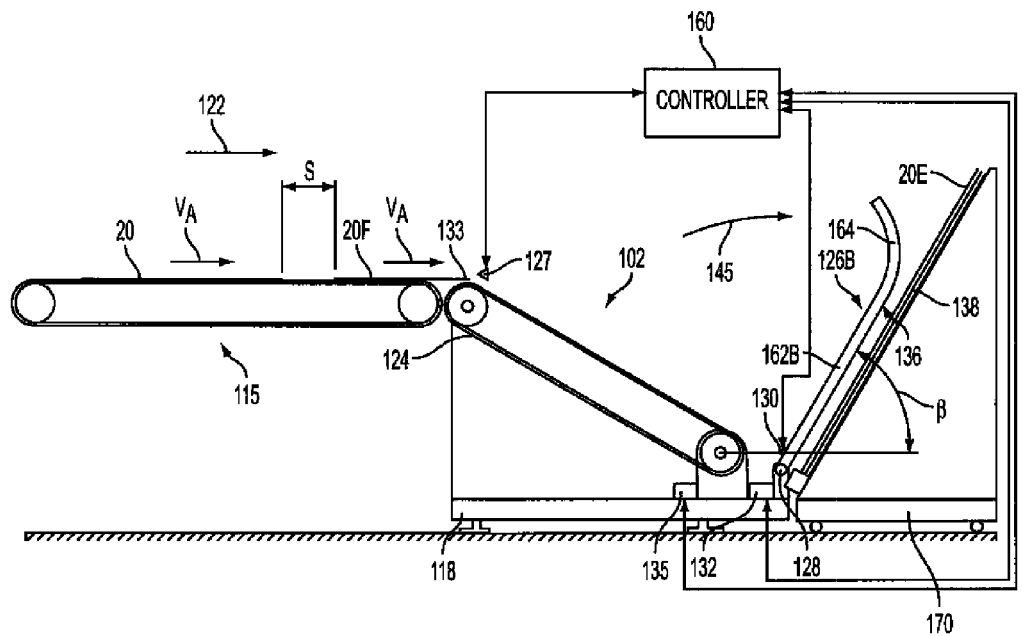
FIG. 3C is a schematic side view of the plate repositioning apparatus of FIG. 3A repositioning the engaged printing plate at the second position.

FIGS. 3B and 3C show additional positions of pivoting members 126B as they are moved along direction 145. FIG. 3C shows pivoting members 126B positioned at second position 136 where they no longer bear printing plate 20E. FIG. 3B shows a positioning of pivoting members 126B in an intermediate position between first position 134 and second position 136 as pivoting members 126B are moved along direction 145. FIG. 3B shows that part of additional portion 166 is now borne by second elements 164. In this example embodiment of the invention, drag forces created by air resistance as printing plate 20E is moved cause the additional portion 166 to bend and be borne by second elements 164. In this example embodiment of the present invention, second elements 164 include a curved portion with a curvature sufficient to prevent kinking or plastic deformation of printing plate 20E as the additional portion 166 bends against second elements 164. In this example embodiment of the invention, the unsupported length of the additional portion 166 decreases as it bends against second elements 164. This effectively stiffens remaining unsupported parts of additional portions. Increasing amounts of additional portion 166 can be borne by second elements 164 as printing plate 20E is moved from the first position 134 towards second position 136.

Second elements 164 are configured to support additional portion 166 in a manner that prevents bending stresses with magnitudes sufficient to cause kinking of printing plate 20. Second elements 164 can be configured to control the deflection of additional portion 166 as printing plate 20E is moved from the first position 134 towards second position 136. Second elements 164 can be configured to control bending stresses as increasing amounts of additional portion 166 are supported as printing plate 20E is moved from the first position 134 towards second position 136. In various embodiments of the invention, second elements 164 can transition with first elements 162B in a substantially tangential fashion to prevent the formation of stress risers. Second elements 164 can include curved portions defined with constant curvatures or varying curvatures (e.g. elliptical, parabolic curves, etc). A particular curvature may be selected in part as a function of a desired manufacturing method.

In some example embodiments of the invention, second elements 164 are configured to have a "bearing length" that is smaller than the corresponding length of additional portion 166. In other words, the entirety of the additional portion 166 need not be borne by second elements 164 as pivoting members 126B move from first position 134 towards second position 136. For example, as parts of the additional portion 166 are bent so to be supported by second elements 164, the effective frontal area of the remaining unsupported parts of the additional portions is reduced. This reduction in effective frontal area in turn reduces the drag forces working on the remaining parts of additional portion 166, thereby reducing bending stresses. In some example embodiments of the invention, the drag forces are reduced to levels insufficient to kink printing plate 20E, and the second elements 164 can be configured to allow these parts of the additional portion 166 to bend over the ends of second elements 164 in a manner similar to that shown in FIG. 3B. Some consideration however must be provided to ensure that the bent form of printing plate 20E still allows the plate to overturn and lay on plate stack 138 when pivoting members 126B are moved to second position 136. It is to be noted that reductions in the effective frontal area of the entirety of printing plate 20E can, in some cases, provide additional benefits. For example reduced drag forces on printing plate 20E as it is moved from the first position 134 towards second position 136 may allow for the use of a smaller or less expensive actuator 132. Additionally or alternatively, reduced drag forces may allow actuator 132 to be operated to reduce the pivoting time $T_{PIV}$ of pivoting members 126B to further improve stacking productivity throughput and allow for smaller plate-to-plate separation distances S.

In this illustrated example embodiment of the invention, first elements 162A and second elements 164B combine to form a pivoting members 126B that are sized to sweep out a region 144B having a radius of curvature $R_B$ as they are moved between first position 134 and second position 136. In this example embodiment of the invention, pivoting members 126B are configured to cause radius of curvature $R_B$ to be less than the length of printing plate 20E. In this example embodiment of the invention, pivoting members 126B are configured to cause radius of curvature $R_B$ to be less than the maximum plate length $L_{MAX}$. In particular, pivoting members 126B are configured to create a radius of curvature $R_B$ suitably sized to accommodate a desired plate-to-plate separation distance S with methods similar to those employed by the example embodiments of the invention illustrated in FIGS. 2A though 2C.

Figure 3D:
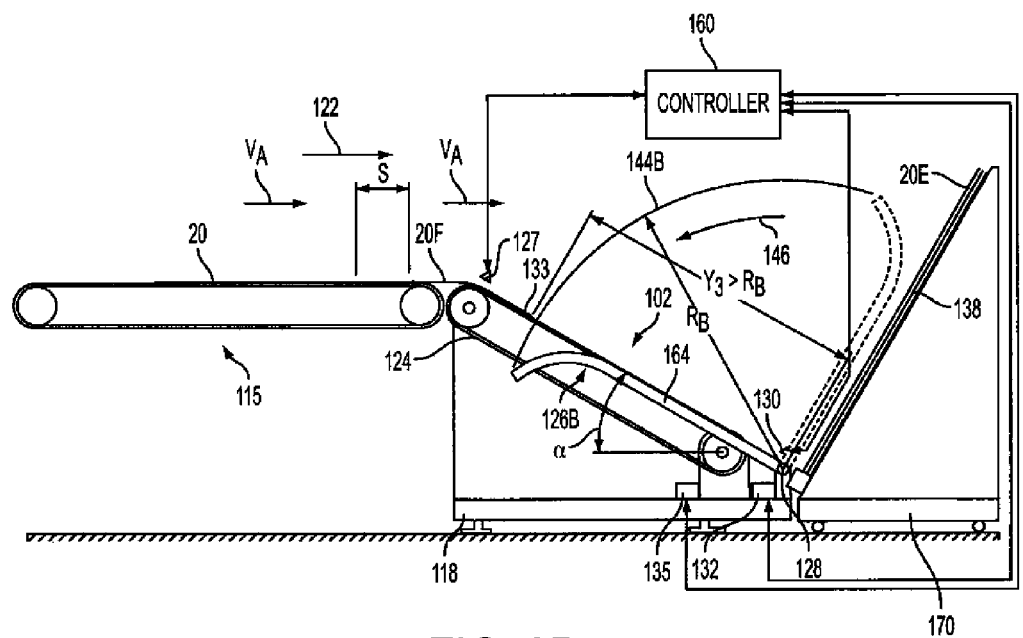
FIG. 3D is a schematic side view of the plate repositioning apparatus of FIG. 3A in which pivoting members have returned to the first position from the second position prior to the arrival of a next printing plate.

An example of this is shown in FIG. 3D which shows pivoting members 126B after they have moved back along direction 146 from second position 136 to their nested position with conveying members 124. In this illustrated embodiment of the invention, a second printing plate 20F has moved and is engaged by conveying members 124 while pivoting members 126B have moved from first position 134 to second position 136 (shown in broken lines) and back towards first position 134. First elements 162B and second elements 164 have been arranged to allow second printing plate 20F to move to a position where its leading edge portion 133 is spaced from pivot 128 by a distance $Y_3$ that is greater than radius of curvature $R_B$. This movement occurs by the time that pivoting members 126B have returned back to first position 134. The configuration of second elements 164 and first elements 162B advantageously accommodates the desired plate-to-plate separation distance S between printing plates 20E and 20F and its corresponding increased system throughput while reducing the occurrence of printing plate damage that can arise from the increased throughputs. For example, the sensor-to-pivoting member distance Z of 600 mm which was selected to additionally decrease the allowable minimum plate-to-plate separation distance $S_{MIN}$ to 451 mm in CASE E of TABLE I can be accommodated by apparatus such as apparatus 102 while reducing the probability of printing plate kinking.

The invention has been described in detail with particular reference to certain preferred embodiments thereof, but it will be understood that variations and modifications can be effected within the scope of the invention.

PARTS LIST 10 plate stacker
15 conveyor
18 base
20 printing plates
20A printing plate
20B printing plate
20C printing plate
20D printing plate
20E printing plate
20F printing plate
21 leading edge portion
22 conveying path
24 conveying belts
26 pivoting members
28 pivot
30 sensor
32 actuator
34 first position
35 drive
36 second position
38 plate stack
100 apparatus
102 apparatus
110 support
115 conveyor
118 base
121 leading edge portion
122 conveying path
123 trailing edge portion
124 conveying members
125A surface
125B imageable surface
125C surface
126A pivoting members
126B pivoting members
127 sensor
128 pivot
129 trailing edge portion
130 sensor
131 leading edge portion
132 actuator
133 leading edge portion
134 first position
135 drive
136 second position
138 plate stack
140 portion
142 additional portion
144A region
144B region
145 direction
146 direction
150 exposure device
152 chemical developer
160 controller
162A first element
162B first element
164 second element
165 first portion
166 additional portion
170 movable carrier
200 printing plate processing system
α inclination angle
β inclination angle
S plate-to-plate separation distance
$V_A$ conveying speed
$V_B$ speed
$V_C$ speed
$L_{MAX}$ maximum plate length
$L_{MIN}$ minimum plate length
$R_A$ radius of curvature $R_B$ radius of curvature
X sensor-to-sensor distance
$Y_1$ first distance
$Y_2$ second distance
$Y_3$ distance
Z sensor-to-pivoting member distance
θ angular extent
b overhanging portion length

The invention claimed is:

1. An apparatus for repositioning recording media, comprising:
   a base;
   a support coupled to the base by a pivot, wherein the support is adapted to bear a portion of the recording media while positioned at a first position and not bear the portion of the recording media while positioned at a second position;
   an actuator adapted to pivot the support about the pivot to move the recording media along a path from the first position towards the second position, wherein a direction of movement of the recording media at each point along the path intersects an imageable surface of the portion of the recording media borne by the support at that point, and wherein the support is adapted to bear an additional portion of the recording media as the recording media is moved from the first position towards the second position;
   wherein the support comprises a first element adapted to bear the portion of the recording media and a second element adapted to bear the additional portion of the recording media, and the actuator is adapted to pivot each of the first element and the second element about the pivot; and
   wherein the additional portion of the recording media overhangs from the first element at the first position.

2. An apparatus according to claim 1, wherein the imageable surface is an imaged surface.

3. An apparatus according to claim 1, wherein the second element is adapted to bear increasing amounts of the additional portion of the recording media as the recording media is moved from the first position towards the second position.

4. An apparatus according to claim 1, wherein the actuator is adapted to pivot the support about the pivot to bend the recording media while moving the recording media from the first position towards the second position to cause the additional portion of the recording media to be borne by the second element.

5. An apparatus according to claim 1, wherein the additional portion of the recording media is spaced further apart from the pivot than the portion of the recording media.

6. An apparatus according to claim 4, wherein the second element comprises a curved portion with a radius of curvature sufficient to prevent kinking of the recording media while bending the recording media.

7. A method for repositioning printing plates, comprising:
   providing a plate stacker comprising a base and a support coupled to the base by a pivot;
   conveying a first printing plate along a conveying path to a first position, wherein a trailing edge of the first printing plate positioned at the first position is spaced apart from the pivot by a first distance;
   effecting relative movement between the first printing plate and the support to cause the support to bear a portion of the first printing plate at the first position, wherein the portion of the first printing plate is less than the entirety of the first printing plate;
   pivoting the support about the pivot to cause the support to oscillate;
   moving the support from the first position to a second position and then back to the first position;
   moving the first printing plate along a path away from the first position;
   conveying a second printing plate along the conveying path, wherein when the support has moved back to the first position from the second position, a leading edge of the second printing plate is spaced apart from the pivot by a second distance that is less than the first distance; and
   wherein the second distance is less than the first distance by an amount not greater than a length of an additional portion of the first printing plate that overhangs from the support at the first position.

8. A method according to claim 7, comprising pivoting the support about the pivot to cause the support to bear an additional portion of the first printing plate as the first printing plate is moved away from the first position along the path.

9. A method according to claim 7, comprising pivoting the support about the pivot to sweep out an arced region, wherein an extent of the arced region is defined by a radius of curvature that is less than the first distance.

10. A method according to claim 7, comprising pivoting the support about the pivot to sweep out an arced region, wherein an extent of the arced region is defined by a radius of curvature that is less than the second distance.

11. A method according to claim 7, comprising bending an additional portion of the first printing plate while moving the first printing plate away from the first position along the path.

12. A method according to claim 7, comprising bending the first printing plate while moving the first printing plate away from the first position along the path to cause the support to bear an additional portion of the first printing plate.

13. A method according to claim 12, comprising bending the first printing plate with radius selected to prevent the first printing plate from plastically deforming while moving the first printing plate away from the first position along the path.

14. A method according to claim 7, wherein the first printing plate is differently sized than the second printing plate.

15. A method according to claim 7, wherein the first printing plate and the second printing plate have different sizes from one another along a direction of the conveying path.

16. A method according to claim 7, wherein moving the first printing plate along the path away from the first position comprises moving the first printing plate along a direction that intersects an imaged surface of the first printing plate at each point along the path.

17. A method for repositioning a printing plate, comprising:
   providing a plate stacker comprising a base and a support coupled to the base by a pivot;
   conveying a first printing plate along a conveying path to a first position, wherein a trailing edge of the first printing plate positioned at the first position is spaced apart from the pivot by a first distance;
   effecting relative movement between the first printing plate and the support to cause the support to bear a portion of the first printing plate;
   pivoting the support about the pivot to move the first printing plate from the first position towards a second position along a path, wherein the direction of movement of the first printing plate at each point along the path intersects an imaged surface of the portion of the first printing plate borne by the support at that point;

bearing an additional portion of the first printing plate as the first printing plate is moved from the first position towards the second position;

pivoting the support about the pivot to sweep out an arced region, wherein an extent of the arced region is defined by a radius of curvature that is less than the first distance; and wherein the additional portion of the first printing plate overhangs from the support at the first position.

18. A method according to claim 17, comprising:

oscillating the support;

moving the support from the first position to a second position and then back to the first position; and conveying a second printing plate along the conveying path, wherein when the support has moved back to the first position from the second position, a leading edge of the second printing plate is spaced apart from the pivot by a second distance that is less than the first distance but greater than the radius of curvature.

19. A method according to claim 17, comprising bending the first printing plate while moving the first printing plate from the first position towards the second position to cause the support to bear the additional portion of the first printing plate.

20. A method according to claim 17, comprising pivoting the support about the pivot to cause the support to bear the additional portion of the first printing plate.

21. A method according to claim 17, comprising pivoting the support about the pivot to cause the support to bear increasing amounts of the additional portion of the first printing plate as the first printing plate is moved from the first position towards the second position.

* * * * *